(12) United States Patent
Kumar

(10) Patent No.: US 6,848,070 B1
(45) Date of Patent: Jan. 25, 2005

(54) ERROR CORRECTING CODE SCHEME

(75) Inventor: Harsh Kumar, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/448,724

(22) Filed: Nov. 24, 1999

(51) Int. Cl.[7] .......................... H03M 13/00; G11C 29/00
(52) U.S. Cl. .................................. 714/758; 714/766
(58) Field of Search ............................ 714/758, 763, 714/769, 766, 799, 819, 6

(56) References Cited

U.S. PATENT DOCUMENTS 5,740,188 A * 4/1998 Olarig ......................... 714/763
5,867,511 A * 2/1999 Arimilli et al. .............. 714/805
6,038,693 A * 3/2000 Zhang ......................... 714/768
6,216,247 B1 * 4/2001 Creta et al. .................. 714/763

* cited by examiner

*Primary Examiner*—Christine T. Tu
(74) *Attorney, Agent, or Firm*—Schwegman, Lundberg, Woessner & Kluth, P.A.

(57) ABSTRACT

An error correction code apparatus has a processor located (on-chip) L2 tag and error correction and detection, and an off-chip L2 data array and second error correction and detection, the chips connected by a data bus. For a write operation, ECC bits are generated and transmitted with data to the off-chip array. New ECC bits are generated and compared to the original ECC bits. Correction is accomplished if needed. For a read operation, stored ECC bits and data are retrieved from the off-chip data array and transmitted to the core processor. New ECC bits are generated and compared to the original ECC bits. Correction is accomplished if needed.

18 Claims, 8 Drawing Sheets

| Check Code | | | | | | | | | | Error Data Bit | |
|---|---|---|---|---|---|---|---|---|---|---|---|
| [9] | [8] | [7] | [6] | [5] | [4] | [3] | [2] | [1] | [0] | | |
| | | | | | | | 1 | 1 | 1 | Dat | 36 |
| | | | | | | 1 | | 1 | 1 | Dat | 37 |
| | | | | | 1 | | | 1 | 1 | Dat | 38 |
| | | | | 1 | | | | 1 | 1 | Dat | 39 |
| | | | 1 | | | | | 1 | 1 | Dat | 40 |
| | | 1 | | | | | | 1 | 1 | Dat | 41 |
| | 1 | | | | | | | 1 | 1 | Dat | 42 |
| | | | | | | | 1 | 1 | 1 | Dat | 43 |
| | | | | | | 1 | | 1 | 1 | Dat | 44 |
| | | | | | 1 | | | 1 | 1 | Dat | 45 |
| | | | | 1 | | | | 1 | 1 | Dat | 46 |
| | | | 1 | | | | | 1 | 1 | Dat | 47 |
| | | 1 | | | | | | 1 | 1 | Dat | 48 |
| 1 | | | | | | | 1 | | 1 | Dat | 49 |
| | | | | | | 1 | 1 | | 1 | Dat | 50 |
| | | | | | 1 | 1 | | | 1 | Dat | 51 |
| | | | | 1 | 1 | | | | 1 | Dat | 52 |
| | | | 1 | 1 | | | | | 1 | Dat | 53 |
| | | 1 | 1 | | | | | | 1 | Dat | 54 |
| | 1 | | 1 | | | | | | 1 | Dat | 55 |
| | 1 | | | | | | | | 1 | Dat | 56 |
| 1 | | | | | | | | | 1 | Dat | 57 |
| | | 1 | 1 | | | | | 1 | | Dat | 58 |
| | 1 | 1 | | | | | | 1 | | Dat | 59 |
| 1 | | 1 | | | | | | 1 | | Dat | 60 |
| | 1 | 1 | | | | | 1 | | | Dat | 61 |
| 1 | 1 | | | | | | 1 | | | Dat | 62 |
| 1 | 1 | | | | | 1 | | | | Dat | 63 |
| | | | | 1 | 1 | 1 | | | | Dat | 64 |
| | | | 1 | 1 | 1 | | | | | Dat | 65 |
| | | 1 | 1 | 1 | | | | 1 | | Dat | 66 |
| | 1 | 1 | 1 | | | | | 1 | | Dat | 67 |
| 1 | 1 | 1 | | | | | | 1 | | Dat | 68 |
| 1 | | | | | | 1 | 1 | | | Dat | 69 |
| | | | | | 1 | 1 | | | | Dat | 70 |
| | | | | 1 | 1 | | | 1 | | Dat | 71 |
| | | 1 | 1 | | | | | 1 | | Dat | 72 |
| | 1 | | | | | 1 | 1 | | | Dat | 73 |
| 1 | | | | | | 1 | | | | Dat | 74 |
| | | | | 1 | 1 | | 1 | | | Dat | 75 |
| | | | 1 | 1 | | | | | | Dat | 76 |
| | 1 | | | | | | 1 | | | Dat | 77 |
| 1 | | | | | | | 1 | | | Dat | 78 |
| | 1 | 1 | 1 | | | | | | | Dat | 79 |
| | 1 | | 1 | | | | 1 | | | Dat | 80 |
| 1 | | | 1 | | | | 1 | | | Dat | 81 |
| 1 | 1 | | | | | | 1 | | | Dat | 82 |

FIG. 9

| Check Code | | | | | | | | | | Error Data Bit | |
|---|---|---|---|---|---|---|---|---|---|---|---|
| [9] | [8] | [7] | [6] | [5] | [4] | [3] | [2] | [1] | [0] | | |
| 1 | | 1 | | | | | | 1 | | Dat | 83 |
| 1 | 1 | | | | | | | 1 | | Dat | 84 |
| | | | 1 | 1 | 1 | | | | | Dat | 85 |
| | | 1 | | 1 | 1 | | | | | Dat | 86 |
| | | 1 | 1 | | 1 | | | | | Dat | 87 |
| | 1 | | | 1 | 1 | | | | | Dat | 88 |
| 1 | | | | 1 | 1 | | | | | Dat | 89 |
| | | 1 | 1 | 1 | | | | | | Dat | 90 |
| | 1 | | 1 | | 1 | | | | | Dat | 91 |
| | 1 | 1 | | | 1 | | | | | Dat | 92 |
| 1 | | | 1 | | 1 | | | | | Dat | 93 |
| | | 1 | 1 | | | 1 | | | | Dat | 94 |
| | 1 | | 1 | 1 | | | | | | Dat | 95 |
| 1 | | 1 | | 1 | | | | | | Dat | 96 |
| | 1 | 1 | | | | 1 | | | | Dat | 97 |
| 1 | | | 1 | | | 1 | | | | Dat | 98 |
| 1 | 1 | | | | | 1 | | | | Dat | 99 |
| | | | 1 | 1 | | 1 | | | | Dat | 100 |
| | | 1 | | 1 | | 1 | | | | Dat | 101 |
| | 1 | | | | 1 | 1 | | | | Dat | 102 |
| 1 | | | | 1 | 1 | | | | | Dat | 103 |
| | | 1 | 1 | | | | 1 | | | Dat | 104 |
| | 1 | | 1 | | 1 | | | | | Dat | 105 |
| 1 | | 1 | | | 1 | | | | | Dat | 106 |
| | 1 | 1 | | | | 1 | | | | Dat | 107 |
| 1 | | 1 | | 1 | | | | | | Dat | 108 |
| 1 | 1 | | | 1 | | | | | | Dat | 109 |
| | | 1 | 1 | 1 | | | | | | Dat | 110 |
| | 1 | | 1 | 1 | | | | | | Dat | 111 |
| 1 | | | 1 | | 1 | | | | | Dat | 112 |
| | 1 | 1 | | | 1 | | | | | Dat | 113 |
| 1 | | 1 | | | 1 | | | | | Dat | 114 |
| 1 | 1 | | | 1 | | | | | | Dat | 115 |
| | 1 | 1 | 1 | | | | | | | Dat | 116 |
| 1 | | 1 | 1 | | | | | | | Dat | 117 |
| 1 | 1 | | 1 | | | | | | | Dat | 118 |
| 1 | 1 | 1 | | | | | | | | Dat | 119 |
| | | | | 1 | 1 | 1 | 1 | 1 | 1 | Dat | 120 |
| | | 1 | 1 | 1 | 1 | 1 | 1 | 1 | | Dat | 121 |
| | 1 | 1 | 1 | 1 | 1 | 1 | 1 | | | Dat | 122 |
| 1 | 1 | 1 | 1 | 1 | 1 | 1 | | | | Dat | 123 |
| 1 | | 1 | 1 | 1 | 1 | 1 | 1 | | 1 | Dat | 124 |
| 1 | 1 | | 1 | 1 | 1 | 1 | 1 | 1 | 1 | Dat | 125 |
| 1 | 1 | 1 | | 1 | 1 | 1 | 1 | 1 | 1 | Dat | 126 |
| 1 | 1 | 1 | 1 | | 1 | 1 | 1 | | 1 | Dat | 127 |

ERROR CORRECTING CODE SCHEME

FIELD

The present invention relates generally to microprocessor functions, and more specifically to microprocessor error correction code schemes.

BACKGROUND

As computers and processors increase speed exponentially, the size of components, from chips to transistors, decreases.

One of the main problems with increased speed of processors, busses, and the like, is that higher operating speeds lead to an increased number of errors in data transmission. Accordingly, various schemes have been employed to detect and correct data errors. Among these schemes are parity checking and error correction and detection, or error correction code (ECC) schemes. Such schemes are known in the art, and will not be described further herein.

Parity checking allows only for the detection of a single bit error in a byte of data. Parity further consumes a fairly large amount of available real estate, and adds on the order of 10 to 15 percent to the cost of memory. Parity ensures reliability of data, but does nothing to improve data reliability. For these reasons, many manufacturers do not use parity checking for main memory, deeming it too expensive in cost and space for the benefits it provides.

ECC can not only determine the presence of a memory data error, but can also fix certain data errors without restarting the computer system. As bus widths and communication speed continue to increase, the comparative costs of ECC schemes become less expensive to implement than parity schemes. However, they do consume real estate and increase costs.

As bus sizes increase, the number of ECC bits traditionally required to fully protect the data increases as well. For a 128 bit data line, typical number of ECC bits required is on the order of 20 to 24 bits depending on the level of protection and correction desired. Further, for the L2 cache, this type of ECC scheme typically absorbs 10–15% of the available chip area. The requirement for upward of 20 or more ECC bits for a 128 bit data bus leads to a slowdown in performance.

When an error in data occurs, traditional solutions for the error is to flush the pipeline of the processor, and restart with fresh data. As processor and bus speeds increase, the solution of flushing the pipeline every time an error occurs would cripple the speed of the processor. To solve this problem, current processors use ECC schemes to prevent some of the slowdown which would be generated by the increased number of errors.

For example, the tag and data arrays of a secondary, or L2, cache, are often protected by ECC. Current schemes include a controller generating ECC bits, and doing ECC checking and error correction on the processor, using a backside bus to transmit 64 bits of data and 25 bits of tag information along with 8 ECC bits to an off-chip L2 cache. This scheme requires two core clock cycles during data return from the L2 cache to identify any problems. If more than one error occurs, the traditional solution of flushing the pipe is used. Another scheme places the L2 cache including tag and data arrays on the core processor. In this scheme, size of the L2 cache becomes an issue.

Speed of access to the L2 cache is also an issue. When L2 cache sits off-chip, the tag lines routed within the chip consume significant real estate. All data accesses are routed through the bus to the off-chip array, leading to further performance slowdowns. The tag and data array components of a cache typically reside together on a chip, be it on the main chip, or off-chip, as in an L2 cache.

SUMMARY

An error correction code (ECC) apparatus embodiment includes a core chip having an L2 tag with ECC bit storage to store sets of ECC bits and a first ECC generation and correction logic module, an off-chip data array having an L2 data array with ECC bit storage to store sets of ECC bits and a second ECC generation and correction logic module, and a bus connecting the core chip and the off-chip data array, the bus capable of transmitting data and sets of ECC bits therebetween.

Other embodiments are described and claimed.

BRIEF DESCRIPTION OF THE DRAWINGS

FIGS. 7, 8, and 9 show first, second, and third portions of Hamming code according to an embodiment of the invention.

DESCRIPTION OF EMBODIMENTS

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

For the purposes of the specification, including claims, the term core or core chip will be used to designate a core, chip, or processor such as the Pentium® line of processors available from Intel Corp. However, core is not limited to any particular processor. The core is often referred to as the processor, and is the main processing unit. Off-chip caches are a secondary separate cache residing on a second chip.

Figure 1:
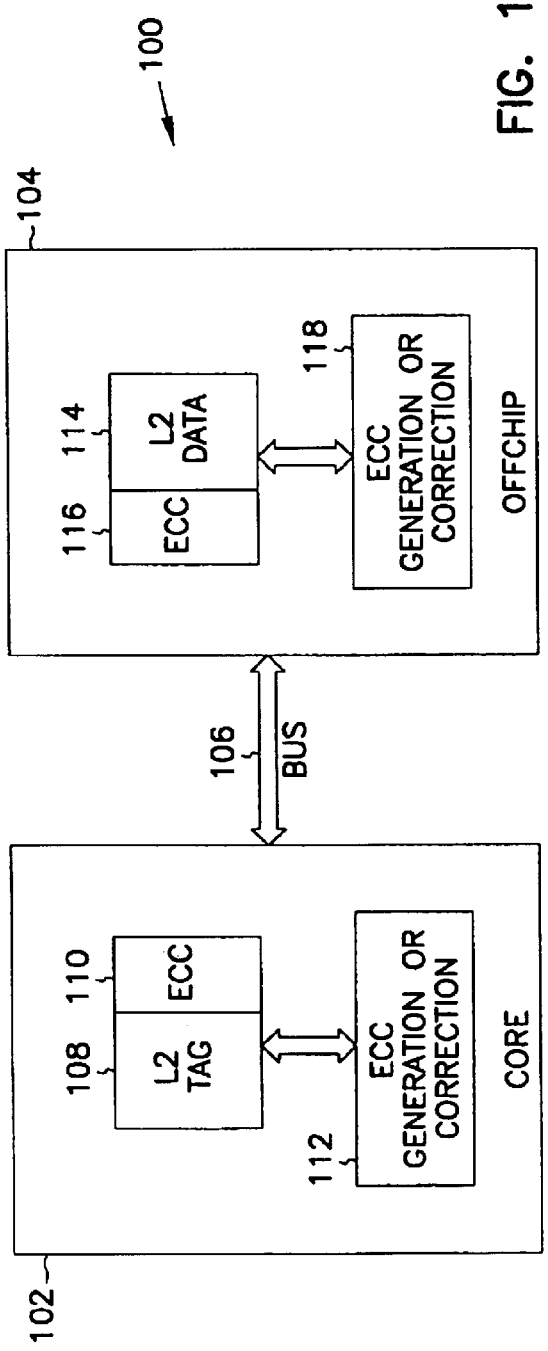
FIG. 1 is a block diagram of an apparatus embodying the invention.

Referring now to the drawings, an ECC apparatus for writing to and reading from a data array 100 is shown in FIG. 1. Apparatus 100 comprises a core 102, and an off-chip or remote L2 chip 104, connected to the core 102 by a backside bus 106. Core 102 has many components which are known to those skilled in the art, but which are omitted from the drawings so as to avoid unnecessary complexity in the figures. Similarly, off-chip L2 chip has many components which are known to those skilled in the art, and which will similarly not be described or shown further. Such components may include addressing and control units, and the like.

Whereas typical caches have both the tag and data arrays located on a single chip, embodiment 100 splits the L2 tag 108 and the L2 data array 114 onto separate chips. In embodiment 100, core 102 contains L2 tag 108 having ECC bit storage 110, and ECC generation and correction logic module 112. Off-chip L2 chip 104 contains L2 data array 114 having ECC bit storage 116 and ECC generation and correction logic module 118. Communication between core 102 and off-chip L2 chip 104, as well as control of the signals and data passed on bus 106 therebetween, is well known in the art and will not be described further herein. Any communication standards and controls may be utilized to effect communication between the chips 102 and 104 without departing from the scope of the invention embodiments.

Figure 7:
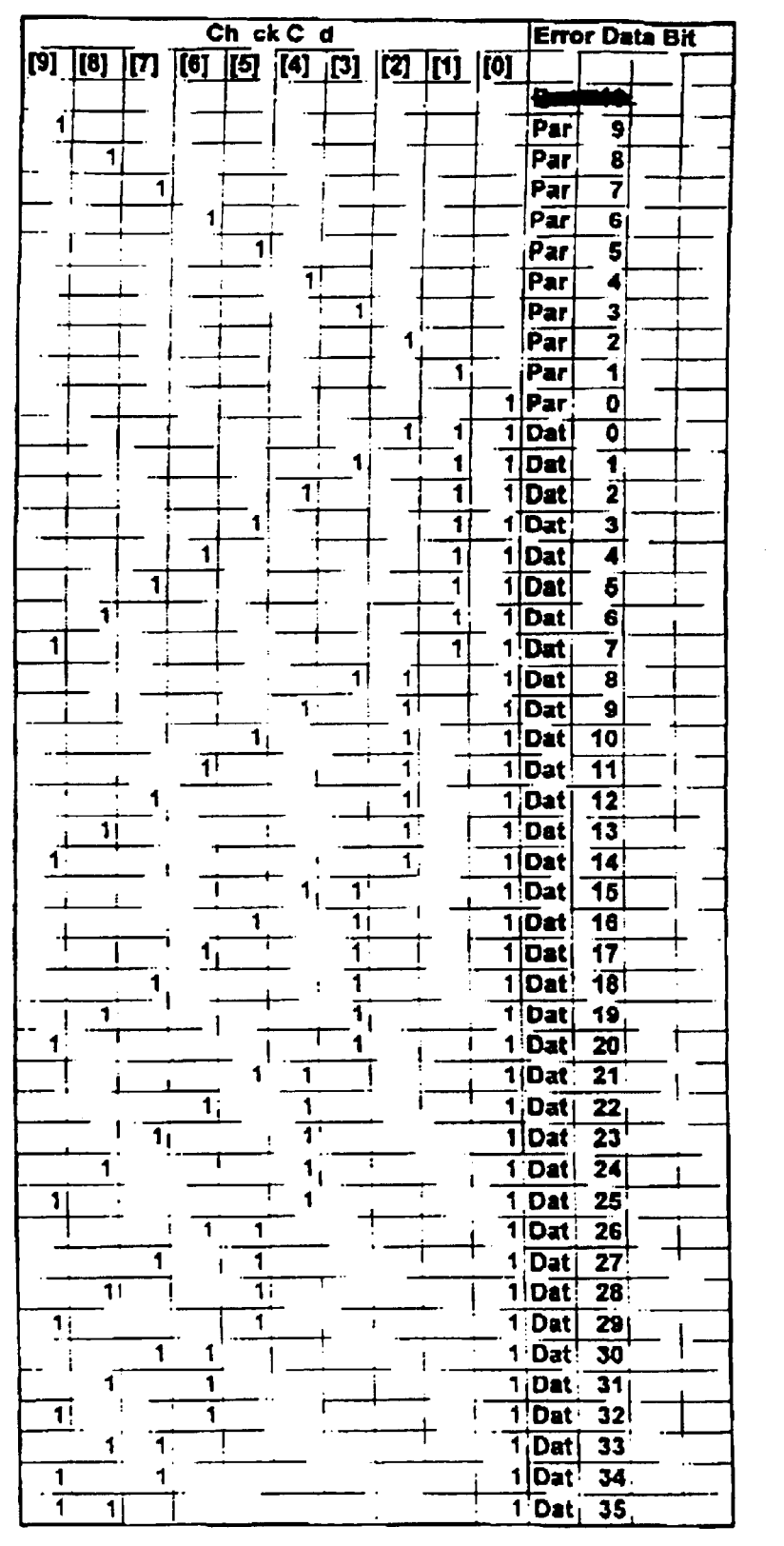

In the embodiment 100, for a 128 bit data line which may also carry 10 parity bits, 10 ECC bits allow for detection and correction for each parity and data bit. Each parity and data bit can be exactly corrected using 10 ECC bits. Hamming code for this correction, used in ECC generation and correction logic modules 112 and 118, is shown in FIGS. 7, 8, and 9.

The use of two separate ECC generation and correction logic modules increases the total amount of space used by ECC logic. However, the location of the L2 tag 108 in the core 102 reduces the number of tag lines required to be routed inside the core 102, saving area. Further, since the L2 tag 108 is located in core 102, not all data accesses will be required to be transmitted over bus 106 to the off-chip L2 chip 104. Instead, data accesses will first be routed to L2 tag 108, the memory directory for L2 data array 114, inside the core 102. The elimination of two transfers of data access information across bus 106 creates a time savings within the processor. For example, if a cache miss occurs, as will be determined by querying L2 tag 108, a request for data is not transmitted over bus 106, but instead a request is made to non-cache memory.

Figure 1A:
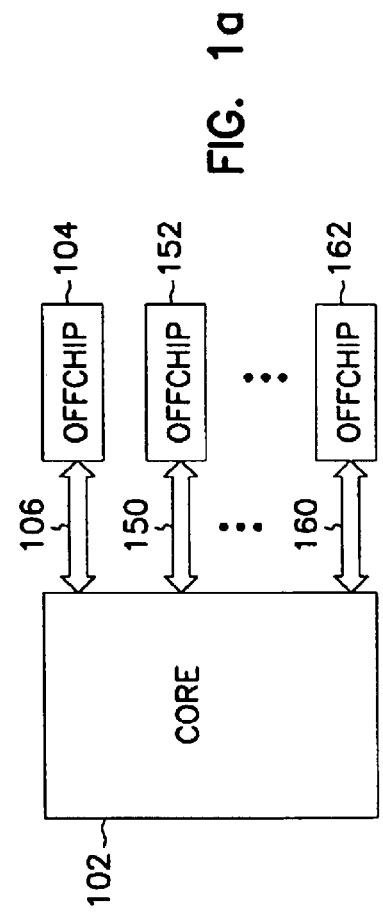
FIG. 1a is a block diagram of an alternative apparatus embodying the invention.

Further, the apparatus embodiment 100 lends itself to easy modular use and application. An optimal amount of off-chip cache has been found to be about four megabytes (MB). Certain applications may be optimally served by an additional two to four MB of off-chip cache. The apparatus embodiment 100 may be implemented in multiples as shown in FIG. 1a. Separate buses 106, 150, and 160 may be used to connect separate off-chip L2 chips 104, 152, and 162 as described above. It should be understood that scalability of the off-chip L2 chips is readily accomplished. The ECC bits for the various L2 chips are stored on the chips, so that retrieval of information data and ECC bits may be accomplished, and the ECC generation and correction logic module 112 in the core 102 may be used for error checking. Full implementation of the embodiment in scalable form would require an increased L2 tag in the core, but some scalable benefits accrue even without an increased L2 tag in core 102.

L2 tag 108 and ECC generation and correction logic module 112 are connected in data communication with each other and with the rest of core 102 for sending and receiving data and transmitting the data to the rest of the core 102 and beyond. Similarly, L2 data array 114 and ECC generation and correction logic module 118 are connected in data communication with each other and with bus 106 for sending information to and receiving information from core 102.

Figure 2:
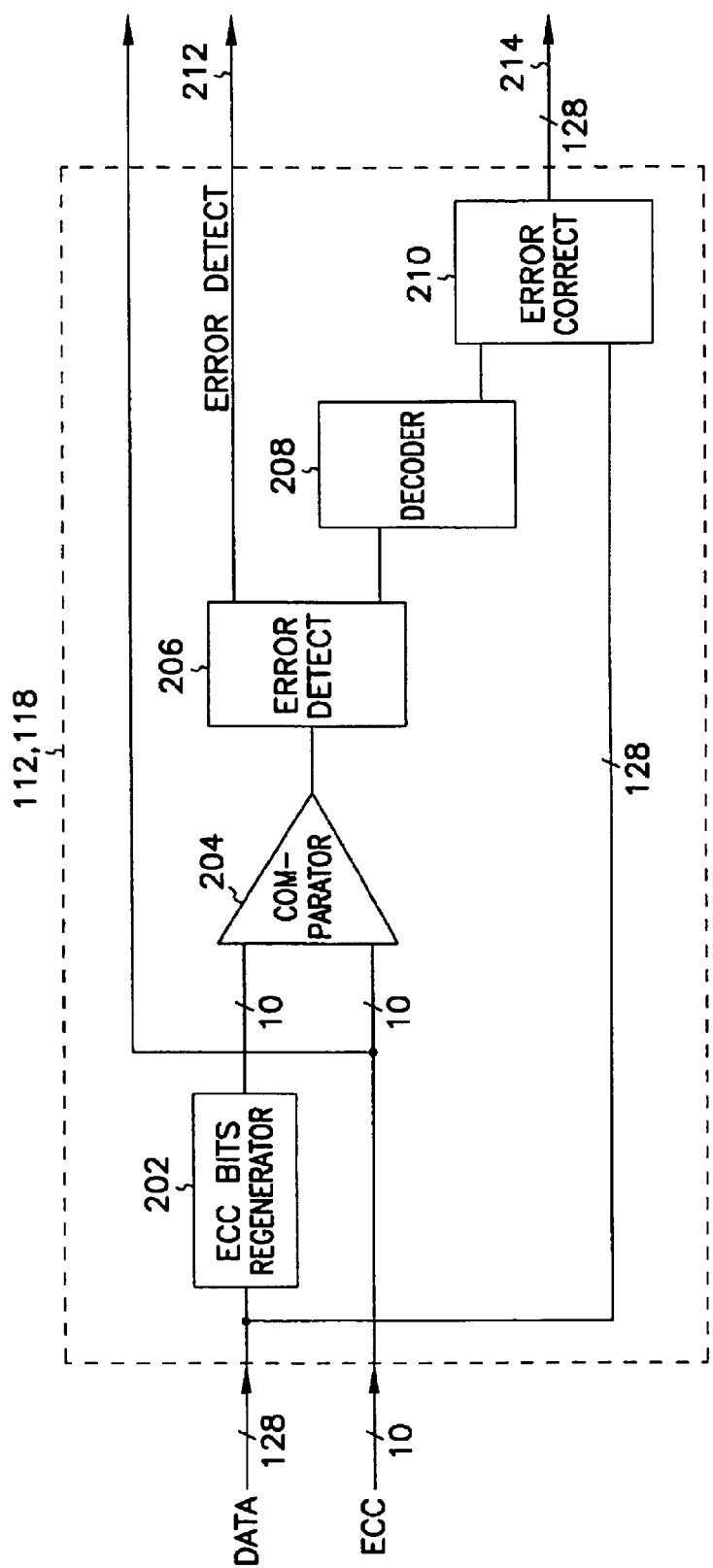
FIG. 2 is a block diagram of an ECC generation and correction logic module.

ECC generation and correction logic modules 112 and 118 are shown in greater detail in FIG. 2. Logic modules 112 and 118 comprise an ECC bits generator or regenerator 202, a comparator 204, an error detect module 206, a decoder 208, and an error correct module 210. Data, in one instance a 128 bit data transmission, and ECC bits associated with the data, are presented to module 112 or 118. The data is split, being sent to ECC bits regenerator 202 and passed through module 112 or 118 for initiation of the read or write sequence, depending upon the function desired to be accomplished with the data. Received data is also presented to error correct module 210.

ECC bits regenerator 202 generates a second set of ECC bits for the data it receives based upon the Hamming code shown in FIGS. 7, 8, and 9. The ECC bits sent with the received data and the newly generated ECC bits based on the received data are presented to the inputs of comparator 204, which generates at its output compare data indicative of whether the first and second sets of ECC bits are identical. The output compare data from comparator 204 will indicate that the ECC bit sets are the same or different. The output of comparator is presented to error detect module 206, which detects whether an error has occurred, and generates error data indicative thereof.

If an error has occurred, error detect module 206 generates an error detect signal 212, and passes the error information to decoder 208. Decoder 208 decodes the error data bit as per the Hamming code of FIGS. 7, 8, and 9, and sends the corresponding generated decoded error bit data to error correct module 210. Error correct module corrects the error data bit and generates corrected data. The error correct module sends the corrected data to output line 214. If an error is detected, the error detect signal 212 indicates that corrected data will be generated. The write or read sequence being carried out is aborted, and the corrected data is sent to be written or outputted for a read cycle as necessary.

The error detect signal may be used to allow a determination of which area of the die is causing errors in data. The location of the error is known. This allows tracing of the data transmission process.

In operation, apparatus 100 works as follows. When a write request is made to write data present in core 102 to L2 data array 114, a first set ECC bits for the data to be sent is generated by ECC generation and correction logic module 112. The data to be written and the ECC bits generated by module 112 are transmitted on bus 106 to off-chip L2 chip 104. A write sequence of the data to the L2 data array 114 is initiated immediately upon receipt of the data. The data is split, and the data and the first set of ECC bits are transmitted to ECC generation and correction logic module 118, where a second set of ECC bits for the received data is generated. The module 118 compares the first set of ECC bits and the second set of ECC bits.

If the sets of ECC bits are identical, either set of identical ECC bits is written to ECC storage 116, and the initiated write sequence to L2 data array 114 proceeds uninterrupted. If, however, the first and second sets of ECC bits are not identical, this indicates an error. The error is corrected as discussed above, and the corrected data and second set of ECC bits are written to the L2 data array 114 and its ECC storage 116, respectively.

A read operation occurs as follows. When a read request is made to read data, the L2 tag 108 in core 102 is accessed. If the desired data is not present in L2 data array 114, the read request is not presented to the off-chip L2 chip 104. Instead, the request can be immediately routed to non-cache memory. If the L2 tag 108 indicates that the desired data is present in the L2 data array 114, the request is transmitted to read data from the L2 data array 114. Data and associated ECC bits from the L2 data array 114 and its ECC storage 116 are retrieved and transmitted on bus 106 to core 102.

A read cycle or sequence to transmit the retrieved and transmitted data to a requested location is initiated immediately upon receipt of the data from L2 data array 114. The data is split, and the data and the first set of ECC bits from ECC storage 116 are transmitted to ECC generation and correction logic module 112, where a second set of ECC bits for the received data is generated. The module 112 compares the first set of ECC bits and the second set of ECC bits.

If the sets of ECC bits are identical, the initiated read cycle to the requested location proceeds uninterrupted. If, however, the first and second sets of ECC bits are not identical, this indicates an error. The error is corrected as discussed above, and the corrected data are sent to the requested location.

Figure 3:
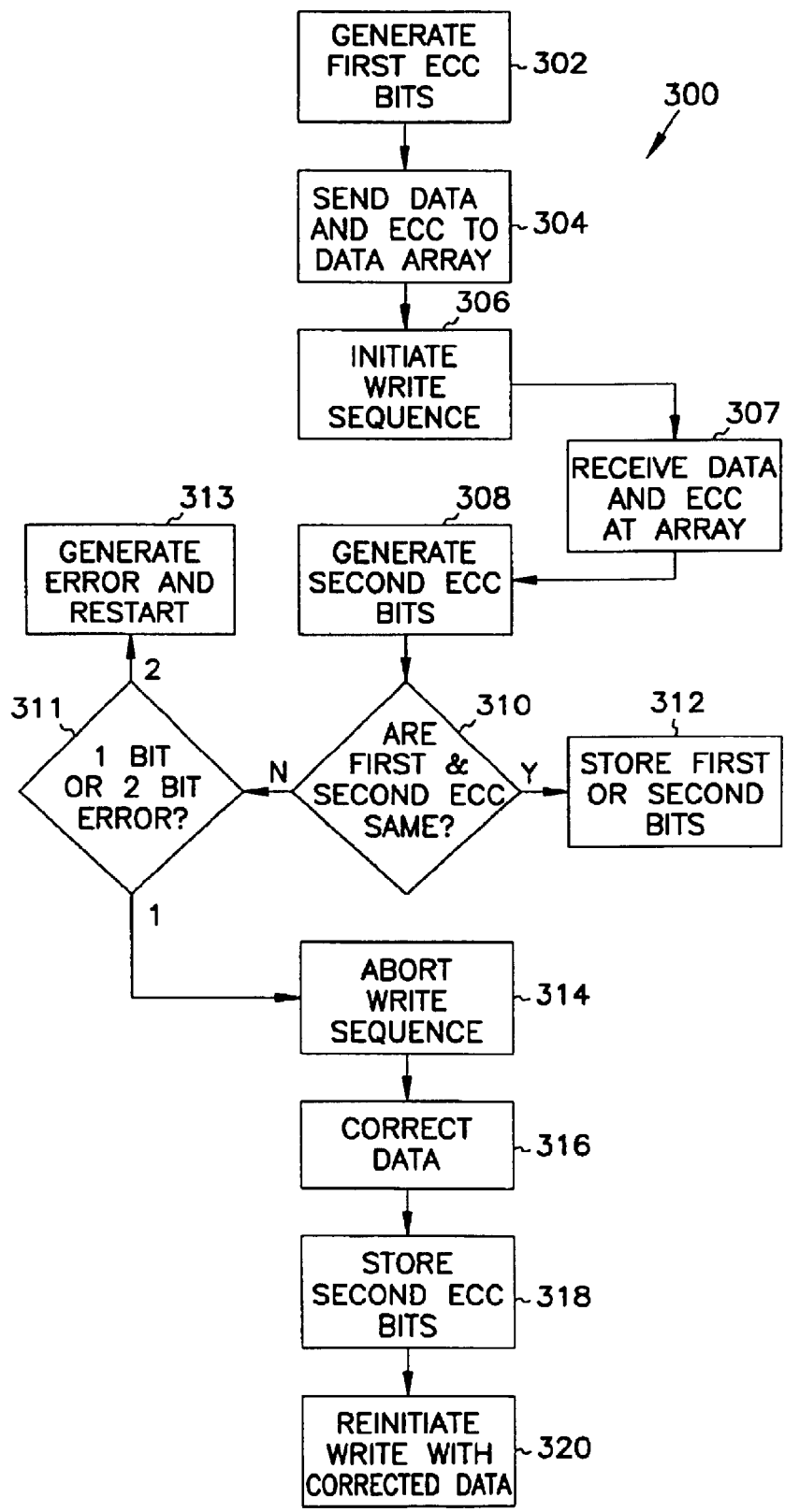
FIG. 3 is a block flow chart diagram of a method embodying the invention.

A method embodiment 300 for writing data to a data array, as shown in FIG. 3, comprises generating first error correction code (ECC) bits from data to be written in block 302, sending the generated ECC bits and data to be written to a data array in block 304, initiating the write sequence with the sent data in block 306, receiving the data and ECC bits at the array in block 307, and generating a second set of ECC bits from the sent data in block 308. Once the second set of ECC bits are generated from the sent data, the first ECC bits and the second ECC bits are compared in block 310 to determine if the first and second ECC bits are identical.

If the first and second sets of ECC bits are identical, the ECC bits are stored in the data array in block 312. Since the first and second sets of ECC bits are identical, either the first or the second set of ECC bits may be stored. The initiated write sequence can be completed without any delay when the first and second sets of ECC bits are identical, since that condition indicates that no errors occurred in the data sent from the core or other generating device to the data array.

If the first and second sets of ECC bits are different, as determined in block 310, it is determined in decision block 311 whether the error encountered is a one (1) bit error or a two (2) bit error. If the encountered error is a two (2) bit error, then an error message is generated in block 313, and the process 300 is restarted. If the error is a one (1) bit error, the initiated write sequence is aborted in block 314, the data is corrected in block 316, the second set of ECC bits is stored in the data array in block 318, and the write sequence is reinitiated with the corrected data in block 320. When the first and second sets of ECC bits are different, the new write sequence initiated in block 320 with the corrected data is begun within one to two clock cycles after the initial write sequence is commenced.

Figure 4:
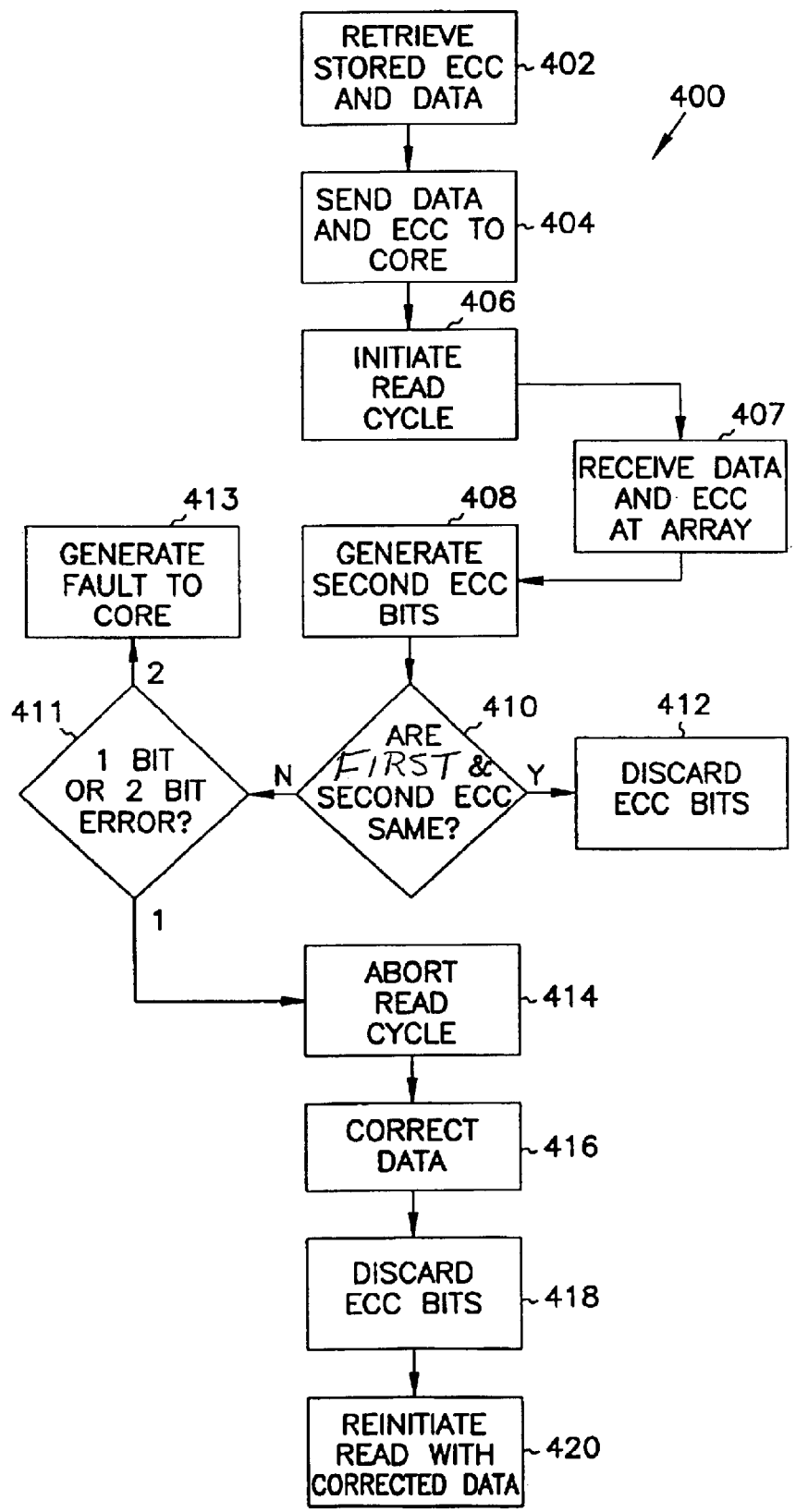
FIG. 4 is a block flow chart diagram of another method embodiment of the invention.

Referring now to FIG. 4, a method embodiment 400 of reading data from a data array comprises retrieving stored data and associated ECC bits in block 402, sending the retrieved data and ECC bits to a core or other processing system in block 404, initiating a read cycle with the sent data in block 406, receiving the data and ECC bits at the array in block 407, and generating a second set of ECC bits from the sent data in block 408. Once the second set of ECC bits is generated from the data retrieved from the data array and sent to the core or other processing system, the first retrieved set of ECC bits and the second generated set of ECC bits are compared in block 410.

If the first and second sets of ECC bits are different, as determined in block 410, it is determined in decision block 411 whether the error encountered is a one (1) bit error or a two (2) bit error. If the encountered error is a two (2) bit error, then a fault to the core message is generated in block 413, and the process 400 must be restarted. If the error is a one (1) bit error, the initiated read cycle is aborted in block 414, the data is corrected in block 416, the ECC bits are discarded in block 418, and the read cycle is reinitiated with the corrected data in block 420. When the first and second sets of ECC bits are different, the new read cycle initiated in block 420 with the corrected data is begun within one to two clock cycles after the initial read cycle is commenced.

Figure 5:
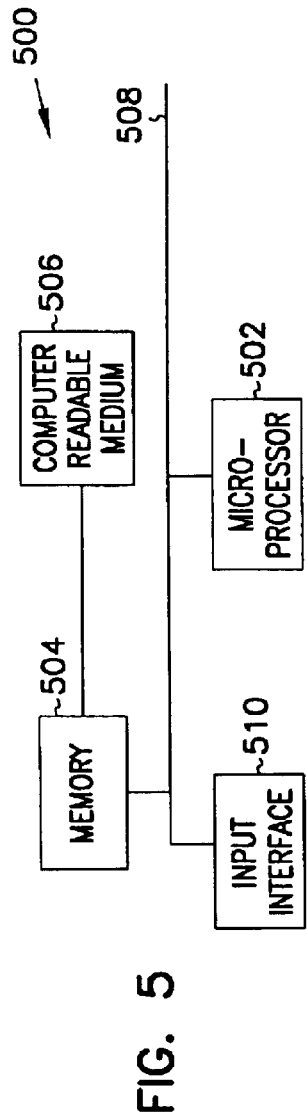
FIG. 5 is a block diagram of a computer system in which the apparatus of FIG. 1 may be implemented.

FIG. 5 shows a block diagram of a computer 500 having a parallel pipeline microprocessor 502 coupled to a memory 504 and to a computer-readable medium 506 through a system bus 508. While only one microprocessor is illustrated in FIG. 5, the computer 500 can also be configured with two or more microprocessors as is well-known in the art. One of skill in the art will readily recognize that memory 504 can be read-only memory (ROM) or random access memory (RAM), and the like, or a combination of memory types. Similarly, one of skill in the art will immediately comprehend that the computer-readable medium 506 can be any type of electronic medium or combination of media including a floppy disk, hard disk, CD-ROM, or the like. The computer-readable medium 506 also equally characterizes electronic signals transmitted through a physical or wireless network to the computer 500. The memory 504 and the computer-readable memory are used to store instructions and data for processing by the microprocessor 502. The processing of instructions and data by the microprocessor is controlled by program logic which can originate in hardware, firmware, or software. Data input is accomplished with input interface 510 such as a keyboard, mouse, touchpad, or combination thereof.

Figure 6:
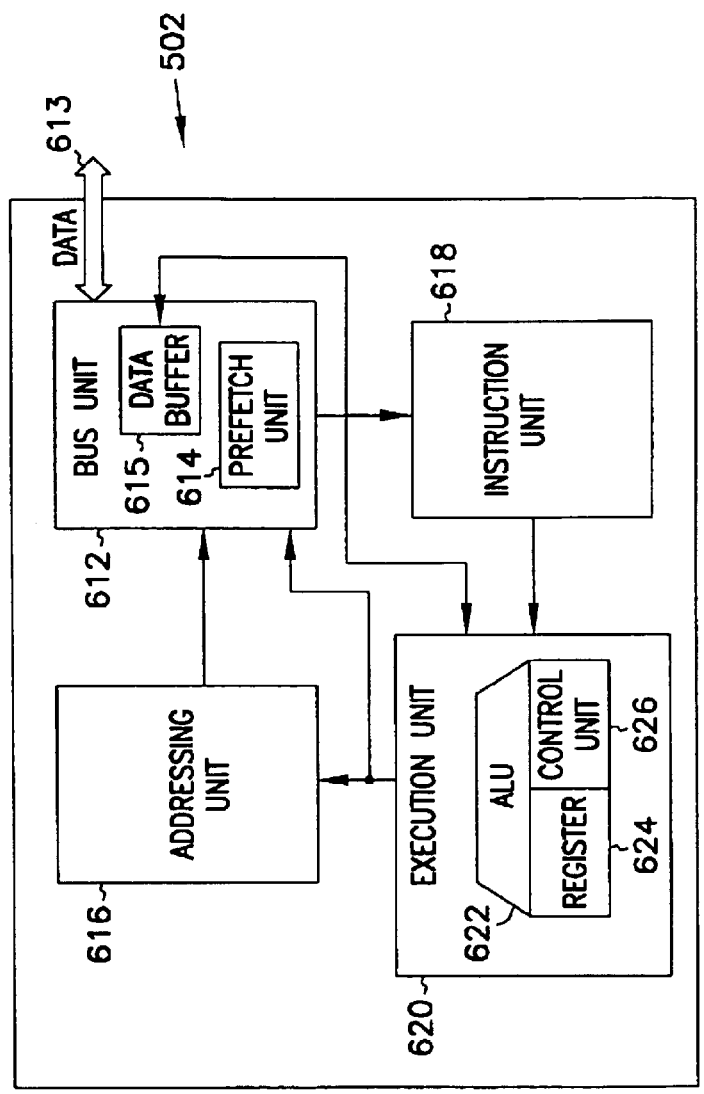
FIG. 6 is a block diagram of a microprocessor in which the apparatus of FIG. 1 may be implemented.

By way of example only, a processor 502 of the type in which embodiments of the invention could be implemented, as shown in FIG. 6, to include bus unit 612 including prefetch unit 614, data buffer 615, addressing unit 616, instruction unit 618, and execution unit 620 which includes an arithmetic logic unit (ALU) 622, registers 624, and control unit 626. Data is received into and transmitted from the bus unit 612 along a data path 613. It should be understood that different processors having different structures could also support embodiments of the invention, and there is no intention to limit the application of the embodiments of the invention to a specific processor.

The methods of the present invention can be implemented in a machine readable medium comprising machine readable instructions for causing a computer to perform the method. Such machine readable medium may include software modules and computer programs. The computer programs comprise multiple modules or objects to perform the methods 300 or 400, or the functions of the apparatus 100 or the modules in apparatus 100. The type of computer programming languages used to write the code may vary between procedural code type languages to object oriented languages. The files or objects need not have a one to one correspondence to the modules or method steps described depending on the desires of the programmer. Further, the method and apparatus may comprise combinations of software, hardware and firmware as is well known to those skilled in the art.

CONCLUSION

Apparatus and method for correcting errors have been described. The apparatus places an L2 tag on the main chip, and an L2 data array off-chip. Both the main chip and the off-chip contain ECC generation and correction logic. On-chip tag reduces the tag routing. Read requests are routed to the on-main chip tag It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An apparatus, comprising:
   a core chip including,
      an L2 tag associated with an L2 data array, the L2 tag including a first Error Correction Code (ECC) bit storage to store a first set of ECC bits, wherein the core chip does not include the L2 data array; and
      a first ECC generation and correction logic module;
   a remote L2 chip including,
      the L2 data array, the L2 data array including a second ECC bit storage to store a second set of ECC bits; and
      a second ECC generation and correction logic module; and
   a bus connecting the core chip and the remote L2 chip, the bus to transmit data of the data array and the sets of ECC bits therebetween.

2. The apparatus of claim 1, wherein the bus is a 128 bit data bus.

3. The apparatus of claim 1, wherein the first and the second sets of ECC bits each comprises 10 bits.

4. The apparatus of claim 1, wherein the first and the second ECC generation and correction logic modules are each connected to receive data and ECC bits from the bus, each ECC generation and correction logic module comprising:
   an ECC bit generator to generate a third set of ECC bits;
   a comparator to generate compare data, the comparator operatively connected to the ECC bit generator to receive the third set of ECC bits therefrom, and to receive the ECC bits from the bus;
   an error detect module to generate error detect data, the error detect module operatively connected to the comparator to receive compare data therefrom;
   a decoder to generate decoded error bit data operatively connected to the error detect module to receive error detect data therefrom; and
   an error correct module to generate corrected data, the error correct module operatively connected to the decoder to receive decoded error bit data therefrom.

5. The apparatus of claim 4, wherein the decoder is to generate error bit data based on a 10 bit Hamming code.

6. An apparatus comprising:
   an Error Correction Code (ECC) bit generator to generate, internal to a processor core, a first set of ECC bits, wherein the generation is in response to an L2 tag hit, wherein the L2 tag is in the processor core, and wherein the L2 tag is associated with an L2 data array that is not in the processor core;
   a comparator to generate compare data, the comparator operatively connected to the ECC bit generator to receive the first set of ECC bits therefrom, and to receive a second set of ECC bits, wherein the second set of ECC bits is received from the L2 data array;
   an error detect module to generate error detect data, the error detect module operatively connected to the comparator to receive compare data therefrom;
   a decoder to generate decoded error bit data operatively connected to the error detect module to receive error detect data therefrom; and
   an error correct module operatively connected to the decoder to receive decoded error bit data therefrom, and to generate corrected data from external data and the decoded error bit data.

7. The apparatus of claim 6, wherein the first and the second sets of ECC bits each comprises 10 bits.

8. The apparatus of claim 6, wherein the decoder is to generate decoded error bit data based on a 10 bit Hamming code.

9. The apparatus of claim 6, wherein the L2 data array is included in an L2 cache.

10. A system comprising:
    a microprocessor having an error correction code (ECC) apparatus, comprising,
       a core chip including a first ECC generation and correction logic module, an L2 tag, and storage for a first set of ECC bits, wherein the L2 tag is associated with an L2 data array, and wherein the L2 data array is not included in the core chip;
       a remote L2 chip including the L2 data array, storage for a second set of ECC bits, and a second ECC generation and correction logic module; and
       a backside bus connecting the core chip and the remote L2 chip, the bus to transmit data and ECC bits therebetween;
    a random access memory to store instructions to be processed by the microprocessor, wherein the random access memory is coupled to the microprocessor through a system bus; and
    a computer-readable medium to store instructions and data to be processed by the microprocessor, wherein the computer-readable medium is coupled to the microprocessor through the system bus.

11. The system of claim 10, wherein the bus is a 128 bit data bus.

12. The system of claim 10, wherein the first and the second sets of ECC bits each comprises 10 bits.

13. The system of claim 12, wherein the decoder generates error detect data based on a 10 bit Hamming code.

14. The system of claim 10, wherein the first and the second ECC generation and correction logic modules are each connected to receive data and ECC bits from the bus, each ECC logic module comprising:
    an ECC bit generator to generate a third set of ECC bits;
    a comparator to generate compare data, the comparator operatively connected to the ECC bit generator to receive the third set of ECC bits therefrom, and to receive the ECC bits from the bus;
    an error detect module to generate error detect data, the error detect module operatively connected to the comparator to receive compare data therefrom;
    a decoder to generate decoded error bit data operatively connected to the error detect module to receive error detect data therefrom; and
    an error correct module to generate corrected data, the error correct module operatively connected to the decoder to receive decoded error bit data therefrom.

15. A microprocessor comprising:
    a prefetch unit;
    an addressing unit;
    an instruction unit;
    an execution unit having an arithmetic logic unit, at lease one register, and a control unit; and
    an error correction code (ECC) apparatus, comprising,
       a core chip including a first ECC generation and correction logic module, an L2 tag, and a first storage for a first set of ECC bits, wherein the L2 tag is associated with an L2 data array, and wherein the L2 data array is not included in the core chip;

a remote L2 chip including the L2 data array, a second storage for a second set of ECC bits, and a second ECC generation and correction logic module; and a bus connecting the core chip and the off-chip data array, the bus to transmit data of the data arrays and the sets of ECC bits therebetween.

16. The microprocessor of claim 15, wherein the bus is a 128 bit data bus.

17. The microprocessor of claim 15, wherein the first and the second sets of ECC bits each comprises 10 bits.

18. The microprocessor of claim 15, wherein the first and the second ECC generation and correction logic modules are each connected to receive data and ECC bits from the bus, each ECC logic module comprising:

an ECC bit generator to generate a second set of ECC bits;

a comparator to generate compare data, the comparator operatively connected to the ECC bit generator to receive the second set of ECC bits therefrom, and to receive the ECC bits from the bus;

an error detect module to generate error detect data, the error detect module operatively connected to the comparator to receive compare data therefrom;

a decoder to generate decoded error bit data operatively connected to the error detect module to receive error detect data therefrom; and an error correct module to generate corrected data, the error correct module operatively connected to the decoder to receive decoded error bit data therefrom.

* * * * *

UNITED STATES PATENT AND TRADEMARK OFFICE
CERTIFICATE OF CORRECTION

PATENT NO. : 6,848,070 B1
DATED : January 25, 2005
INVENTOR(S) : Kumar

It is certified that error appears in the above-identified patent and that said Letters Patent is hereby corrected as shown below:

Column 8,
Line 63, delete "at lease" and insert -- at least --, therefor.

Signed and Sealed this

Thirtieth Day of August, 2005

JON W. DUDAS
*Director of the United States Patent and Trademark Office*